US012635220B2

(12) United States Patent
Park et al.

(10) Patent No.: US 12,635,220 B2
(45) Date of Patent: May 19, 2026

(54) RECOVERING TOP SPACER WIDTH OF NANOSHEET DEVICE

(71) Applicant: International Business Machines Corporation, Armonk, NY (US)

(72) Inventors: Chanro Park, Clifton Park, NY (US); Ruilong Xie, Niskayuna, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 17/381,870

(22) Filed: Jul. 21, 2021

(65) Prior Publication Data

US 2023/0027413 A1 Jan. 26, 2023

(51) Int. Cl.
| | |
|---|---|
| *H10D 64/66* | (2025.01) |
| *H10D 30/01* | (2025.01) |
| *H10D 30/67* | (2025.01) |
| *H10D 62/10* | (2025.01) |

(Continued)

(52) U.S. Cl.
CPC ......... *H10D 64/671* (2025.01); *H10D 30/031* (2025.01); *H10D 30/6729* (2025.01); *H10D 30/6735* (2025.01); *H10D 30/6739* (2025.01); *H10D 30/6757* (2025.01); *H10D 62/118* (2025.01); *H10D 64/015* (2025.01); *H10D 64/017* (2025.01); *H10D 64/018* (2025.01); *H10D 64/021* (2025.01); *H10P 14/3452* (2026.01)

(58) Field of Classification Search
CPC ............. H01L 29/4983; H01L 21/0259; H01L 29/0665; H01L 29/41733; H01L 29/42392; H01L 29/4908; H01L 29/6653; H01L 29/66545; H01L 29/66553; H01L 29/6656; H01L 29/66742; H01L 29/78696; H10D 30/6739; H10D 30/6757; H10D 30/6735; H10D 30/6729; H10D 30/031; H10D 64/018; H10D 64/017; H10D 62/118; H10D 64/021; H10D 64/671; H10D 64/015; H10P 14/3452

See application file for complete search history.

(56) References Cited

U.S. PATENT DOCUMENTS

| | | | |
|---|---|---|---|
| 6,245,620 | B1 | 6/2001 | Jang et al. |
| 8,174,060 | B2 | 5/2012 | Curello et al. |
| 9,006,087 | B2 | 4/2015 | Chang et al. |

(Continued)

FOREIGN PATENT DOCUMENTS

FR 2860920 A1 4/2005

*Primary Examiner* — Norman D Richards
*Assistant Examiner* — Sean Ayers Winters
(74) *Attorney, Agent, or Firm* — Gavin Giraud

(57) ABSTRACT

Techniques for recovering the width of a top gate spacer in a field-effect transistor (FET) device are provided. In one aspect, a FET device includes: at least one gate; source/drain regions present on opposite sides of the at least one gate; gate spacers offsetting the at least one gate from the source/drain regions, wherein each of the gate spacers includes an L-shaped spacer alongside the at least one gate and a dielectric liner disposed on the L-shaped spacer; and at least one channel interconnecting the source/drain regions. A method of forming a FET device is also provided which includes recovering the width of the top gate spacer using the dielectric liner.

16 Claims, 8 Drawing Sheets

(51) Int. Cl.
| | | |
|---|---|---|
| *H10D 64/01* | (2025.01) | |
| *H10P 14/20* | (2026.01) | |

(56) References Cited

U.S. PATENT DOCUMENTS

| | | | | |
|---|---|---|---|---|
| 9,564,437 | B1 | 2/2017 | Basker et al. | |
| 9,595,597 | B1 | 3/2017 | Basker et al. | |
| 9,601,621 | B1 | 3/2017 | Basker et al. | |
| 9,748,335 | B1 | 8/2017 | Bentley et al. | |
| 9,941,352 | B1 | 4/2018 | Bi et al. | |
| 10,410,931 | B2 | 9/2019 | Kang et al. | |
| 2002/0086473 | A1 | 7/2002 | Tsai et al. | |
| 2018/0294331 | A1* | 10/2018 | Cho | H01L 29/0649 |
| 2019/0006485 | A1* | 1/2019 | Kim | H01L 29/0673 |
| 2019/0074362 | A1* | 3/2019 | Lee | H01L 29/775 |
| 2019/0081155 | A1 | 3/2019 | Xie et al. | |
| 2019/0181238 | A1 | 6/2019 | Wang et al. | |
| 2019/0237559 | A1* | 8/2019 | Cheng | H01L 29/0847 |
| 2019/0252516 | A1 | 8/2019 | Cheng et al. | |
| 2020/0027959 | A1* | 1/2020 | Cheng | H10D 64/679 |
| 2020/0035840 | A1* | 1/2020 | Vellianitis | H01L 29/045 |
| 2020/0312981 | A1* | 10/2020 | Bomberger | H01L 21/0245 |
| 2020/0365733 | A1* | 11/2020 | Song | H01L 29/0847 |
| 2020/0381547 | A1* | 12/2020 | Song | H01L 29/66795 |
| 2020/0395446 | A1* | 12/2020 | Yi | H10D 30/6757 |
| 2020/0411667 | A1* | 12/2020 | Wong | H01L 29/0653 |
| 2021/0028173 | A1* | 1/2021 | Yang | B82Y 10/00 |
| 2021/0035870 | A1* | 2/2021 | Young | H10D 84/038 |
| 2021/0036122 | A1* | 2/2021 | Wong | B82Y 10/00 |
| 2021/0066477 | A1* | 3/2021 | Lee | H01L 29/66545 |
| 2021/0126099 | A1* | 4/2021 | Young | H01L 29/66439 |
| 2021/0167059 | A1* | 6/2021 | Lee | H01L 29/42392 |
| 2021/0202238 | A1* | 7/2021 | Wang | H01L 21/308 |

* cited by examiner

RECOVERING TOP SPACER WIDTH OF NANOSHEET DEVICE

FIELD OF THE INVENTION

The present invention relates to field-effect transistor (FET) devices such as nanosheet FETs, and more particularly, to techniques for recovering the width of a top gate spacer in a nanosheet FET lost during fabrication, thereby reducing the risk for source/drain-to-gate shorting.

BACKGROUND OF THE INVENTION

In field-effect transistor (FET) devices such as a nanosheet FET, source/drain regions are interconnected by a channel(s). A gate regulates current flow through the channel(s). Nanosheets form the channels in a nanosheet FET.

In such devices, gate spacers are typically employed to offset the gate from the source/drain regions on opposite sides of the gate. However, during fabrication, the gate spacers are repeatedly exposed to processing conditions that can significantly erode the spacer width. With a smaller gate spacer, there is a greater chance of shorting between the source/drain and the gate.

A potential solution to this problem might be to simply employ a larger spacer to begin with in order to compensate for the loss of spacer width. However, with the continued scaling of device dimensions, there is only a limited gap between the gates of adjacent devices. Thus, in many cases, there is no extra room in which to initially place a wider spacer.

Therefore, techniques for effectively recovering the width of the gate spacer lost to erosion in scaled devices, and thereby reducing the risk of source/drain-to-gate shorting would be desirable.

SUMMARY OF THE INVENTION

The present invention provides techniques for recovering the width of a top gate spacer in a field-effect transistor (FET) device, such as a nanosheet FET, lost during fabrication thereby reducing the risk for source/drain-to-gate shorting. In one aspect of the invention, a FET device is provided. The FET device includes: at least one gate; source/drain regions present on opposite sides of the at least one gate; gate spacers offsetting the at least one gate from the source/drain regions, wherein each of the gate spacers includes an L-shaped spacer alongside the at least one gate and a dielectric liner disposed on the L-shaped spacer; and at least one channel interconnecting the source/drain regions.

In another aspect of the invention, a method of forming a FET device is provided. The method includes: forming at least one gate over at least one channel; forming source/drain regions on opposite sides of the at least one gate; forming bilayer gate spacers on opposite sides of the at least one gate, wherein each of the bilayer gate spacers includes a first spacer layer alongside the at least one gate, and a second spacer layer disposed on the first spacer layer; selectively removing the second spacer layer to form gaps between the at least one gate and the source/drain regions; trimming the source/drain regions to increase the gaps; and depositing a dielectric liner onto the at least one gate and into the gaps, wherein the first spacer layer and the dielectric liner serve as gate spacers that offset the source/drain regions from the at least one gate.

A more complete understanding of the present invention, as well as further features and advantages of the present invention, will be obtained by reference to the following detailed description and drawings.

DETAILED DESCRIPTION OF PREFERRED EMBODIMENTS

As highlighted above, erosion of the gate spacer during fabrication of field-effect transistor (FET) devices such as nanosheet FETs can undesirably lead to source/drain-to-gate shorts, especially with scaled devices where the initial spacer width is limited. Advantageously, provided herein are techniques for recovering the width of the top spacer lost during fabrication. As will be described in detail below, the present techniques employ a bilayer top spacer design which enables the gap between the gate and the source/drain epitaxy to be increased, thereby significantly reducing the shorting risk. Namely, following formation of the source/drain epitaxy, selective removal of the outer layer of the bilayer top spacer exposes the epitaxy sidewall. The source/drain epitaxy can then be trimmed to enlarge its gap with the gate. The removed outer layer of the bilayer top spacer is then replaced with a dielectric liner.

For instance, an exemplary methodology for forming a FET device in accordance with the present techniques is now described by way of reference to FIGS. 1-15. It is notable that, while the present example involves the fabrication of a nanosheet FET, the present techniques are more generally applicable to any type of FET architecture.

Figure 1:
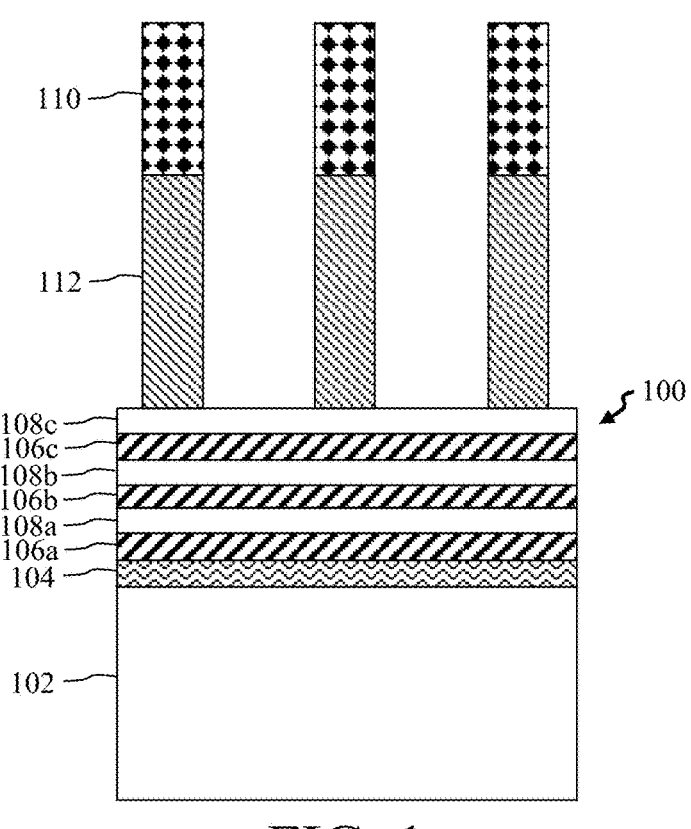
FIG. 1 is a cross-sectional diagram illustrating a stack of sacrificial and active layers having been formed on a substrate, and sacrificial gates/sacrificial gate hardmasks having been formed on the stack according to an embodiment of the present invention.

As shown in FIG. 1, the process begins with the formation of a stack 100 of sacrificial and active layers on a substrate 102. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 102 may already have pre-built structures (not shown) such as transistors, diodes, capacitors, resistors, interconnects, wiring, etc.

According to an exemplary embodiment, stack 100 is formed by first depositing sacrificial and active layers on substrate 102, oriented vertically one on top of another. For instance, in one exemplary embodiment the sacrificial and active layers are nanosheets that are formed as the stack 100 on substrate 102. The term 'nanosheet,' as used herein, generally refers to a sheet or a layer having nanoscale dimensions. Further, the term 'nanosheet' is meant to encompass other nanoscale structures such as nanowires. For instance, the term 'nanosheet' can refer to a nanowire with a larger width and/or the term 'nanowire' can refer to a nanosheet with a smaller width, and vice versa.

More specifically, as shown in FIG. 1, stack 100 can include a (first) sacrificial layer 104 deposited on the substrate 102, and alternating layers of (second) sacrificial layers 106*a,b,c*,etc. and active layers 108*a,b,c*,etc. deposited on sacrificial layer 104. The term 'sacrificial' as used herein refers to a structure that is removed, in whole or in part, during fabrication of the FET device. By contrast, active layers 108*a,b,c*,etc. will remain in place and serve as channels of the FET device. Further, it is notable that the number of sacrificial layers 106*a,b,c*,etc. and active layers 108*a,b, c*,etc. shown is merely an example, and embodiments are contemplated herein where more or fewer sacrificial layers 106*a,b,c*,etc. and/or more or fewer active layers 108*a,b,c,* etc. than shown are present.

According to an exemplary embodiment, the sacrificial layer 104 and each of the sacrificial layers 106*a,b,c*,etc./ active layers 108*a,b,c*,etc. are deposited/formed on substrate 102 using an epitaxial growth process. In one embodiment, the sacrificial layer 104 and the sacrificial layers 106*a,b,c*, etc./active layers 108*a,b,c*,etc. each have a thickness of from about 10 nanometers (nm) to about 25 nm and ranges therebetween.

The materials employed for sacrificial layers 106*a,b,c*,etc. and active layers 108*a,b,c*,etc. are selected such that the sacrificial layers 106*a,b,c*,etc. can be removed selective to the active layers 108*a,b,c*,etc. during fabrication. Further, as will be described in detail below, the material selected for the sacrificial layer 104 will enable sacrificial layer 104 to be removed selective to the sacrificial layers 106*a,b,c*,etc. in order to form a bottom dielectric isolation layer. Use of a bottom dielectric isolation layer prevents source/drain-to-source/drain leakage via the substrate 102.

By way of example only, according to one exemplary embodiment, the sacrificial layer 104 and the sacrificial layers 106*a,b,c*,etc. are each formed from SiGe, while active layers 108*a,b,c*,etc. are each formed from Si. In that manner, etchants such as wet hot SC1, vapor phase hydrogen chloride (HCl), vapor phase chlorine trifluoride ($ClF_3$) and other reactive clean processes (RCP) are selective for etching of SiGe versus Si, and thus can be employed to selectively remove the sacrificial layers relative to the active layers.

Furthermore, high germanium (Ge) content SiGe can be removed selective to low Ge content SiGe using an etchant such as dry HCl. Thus, according to an exemplary embodiment, sacrificial layer 104 is formed from SiGe having a high Ge content. For instance, in one exemplary embodiment, a high Ge content SiGe is SiGe having from about 50% Ge to about 100% Ge (i.e., pure Ge) and ranges therebetween. For instance, in one non-limiting example, sacrificial layer 104 is formed from SiGe65 (which is SiGe having a Ge content of about 65%). The use of a higher Ge content SiGe will enable the sacrificial layer 104 to be selectively removed relative to the sacrificial layers 106*a, b,c*,etc. when forming the bottom dielectric isolation layer (as described below). In that case, sacrificial layers 106*a,b, c*,etc. are preferably formed from a low Ge content SiGe. For instance, in one exemplary embodiment, a low Ge content SiGe is SiGe having from about 20% Ge to about 50% Ge and ranges therebetween. For instance, in one non-limiting example, the sacrificial layers 106*a,b,c*,etc. are formed from SiGe30 (which is SiGe having a Ge content of about 30%).

As will be described in detail below, a replacement metal gate or RMG process is employed herein where sacrificial gates are formed early on in the process and serve as placeholders during source/drain formation. Later on, the sacrificial gates are removed and replaced with the final gates of the FET device. According to an exemplary embodiment, these 'replacement' gates are formed from metal gate stack materials, and are also referred to herein as 'replacement metal gates.' The use of a replacement metal gate process is advantageous as it prevents exposure of the metal gate stack materials to potentially damaging conditions during processing. For instance, the high-κ dielectrics (see below) used in the replacement metal gate stacks can be damaged by exposure to high temperatures. Accordingly, with the replacement metal gate process, these gate stack materials are only placed near the end of the process after such high temperature anneals have been performed.

As shown in FIG. 1, to begin the replacement metal gate process, sacrificial gates 112 are formed on the stack 100 over channel regions of the FET device. It is notable that the number of sacrificial gates 112 shown is merely an example, and embodiments are contemplated herein where more or fewer sacrificial gates 112 than shown are present, including embodiments where a single sacrificial gate 112 is employed. To form the sacrificial gates 112, a sacrificial gate material is first blanket deposited onto the stack 100. Suitable sacrificial gate materials include, but are not limited to, poly-silicon (poly-Si) and/or amorphous silicon (a-Si). A process such as chemical vapor deposition (CVD), atomic layer deposition (ALD) or physical vapor deposition (PVD) can be employed to deposit the sacrificial gate material onto the stack 100. According to an exemplary embodiment, a thin (e.g., from about 1 nm to about 3 nm and ranges therebetween) layer of silicon oxide (SiOx) (not shown) is first formed on the stack 100, followed by the poly-Si and/or a-Si.

Sacrificial gate hardmasks 110 are then formed on the sacrificial gate material marking the footprint and location of each of the sacrificial gates 112. Standard lithography and etching techniques can be employed to form the sacrificial gate hardmasks 110. For instance, with standard lithography and etching techniques, a lithographic stack (not shown), e.g., photoresist/organic planarizing layer (OPL)/anti-reflective coating (ARC), is used to pattern the sacrificial gate hardmasks 110 with the footprint and location of each of each of the sacrificial gates 112. Alternatively, the sacrificial gate hardmasks 110 can be formed by other suitable techniques, including but not limited to, sidewall image transfer (SIT), self-aligned double patterning (SADP), self-aligned quadruple patterning (SAQP), and other self-aligned multiple patterning (SAMP).

Suitable materials for the sacrificial gate hardmasks 110 include, but are not limited to, nitride hardmask materials such as silicon nitride (SiN), silicon oxynitride (SiON) and/or silicon carbide nitride (SiCN), and/or oxide hardmask materials such as SiOx. An etch is then performed using the sacrificial gate hardmasks 110 to pattern the sacrificial gate material into the individual sacrificial gates 112 shown in FIG. 1. A directional (anisotropic) etching process such as reactive ion etching (RIE) can be employed for the sacrificial gate etch.

Figure 2:
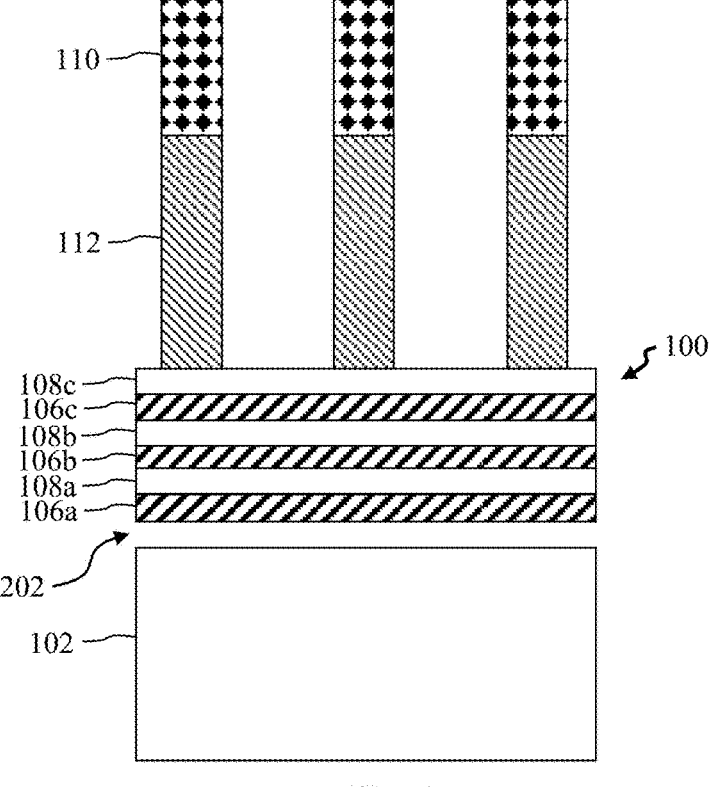
FIG. 2 is a cross-sectional diagram illustrating a sacrificial layer having been selectively removed forming a cavity below the stack according to an embodiment of the present invention.

As shown in FIG. 2, the sacrificial layer 104 is then selectively removed. Removal of the sacrificial layer 104 enables the formation of a bottom dielectric isolation layer beneath the stack 100. As provided above, the use of a bottom dielectric isolation layer advantageously prevents source/drain-to-source/drain leakage via the substrate 102.

As provided above, the sacrificial layer 104 can be formed from high Ge content SiGe (e.g., SiGe having from about 50% Ge to about 100% Ge (i.e., pure Ge) and ranges therebetween, such as SiGe65). In that case, an etchant such as dry HCl can be used to remove sacrificial layer 104 selective to sacrificial layers 106a,b,c,etc. and active layers 108a,b,c,etc. thereby forming a cavity 202 below the remaining layers of stack 100. See FIG. 2.

Figure 3:
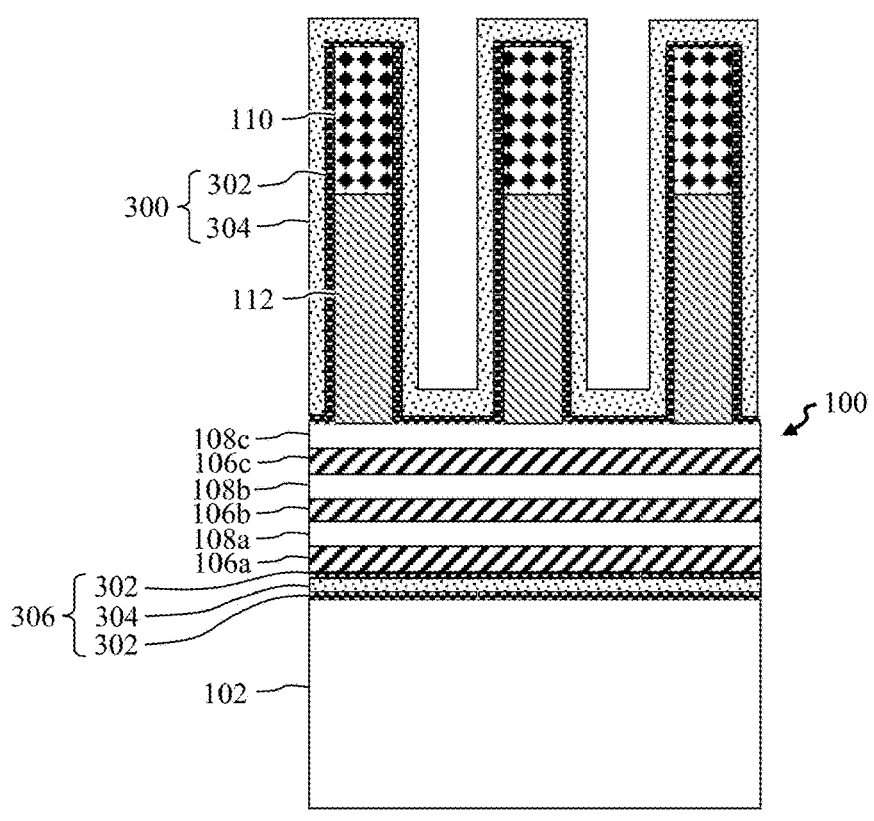
FIG. 3 is a cross-sectional diagram illustrating a bilayer top gate spacer including a first spacer layer and a second spacer layer having been formed alongside the sacrificial gates/sacrificial gate hardmasks, and a bottom dielectric isolation layer having been formed in the cavity according to an embodiment of the present invention.

A bilayer top gate spacer 300, as referenced above, and a bottom dielectric isolation layer 306 are then formed over and alongside the sacrificial gate hardmasks 110/sacrificial gates 112/stack 100 and within the cavity 202, respectively. See FIG. 3. The term 'top' is used to distinguish bilayer gate spacer 300 from the inner spacers that will be formed in the underlying stack 100 (see below). As shown in FIG. 3, the bilayer top gate spacer 300 and the bottom dielectric isolation layer 306 include at least a first spacer layer 302 deposited onto the sacrificial gate hardmasks 110/sacrificial gates 112/stack 100 and lining the cavity 202, respectively, and a second spacer layer 304 deposited onto the first spacer layer. Suitable materials for the first spacer layer 302 include, but are not limited to, silicon oxycarbonitride (SiOCN) and/or silicon borocarbonnitride (SiBCN). Suitable materials for the second spacer layer 304 include, but are not limited to, SiN and/or silicon carbide (SiC). A process such as CVD, ALD or PVD can be employed to deposit the first spacer layer 302 and the second spacer layer 304. According to an exemplary embodiment, the first spacer layer 302 is deposited to a thickness of from about 1 nm to about 4 nm and ranges therebetween, and the second spacer layer 304 is deposited to a thickness of from about 2 nm to about 10 nm and ranges therebetween. As shown in FIG. 3, as deposited, the first spacer layer 302 and the second spacer layer 304 fully fill the cavity 202, forming bottom dielectric isolation layer 306.

Figure 4:
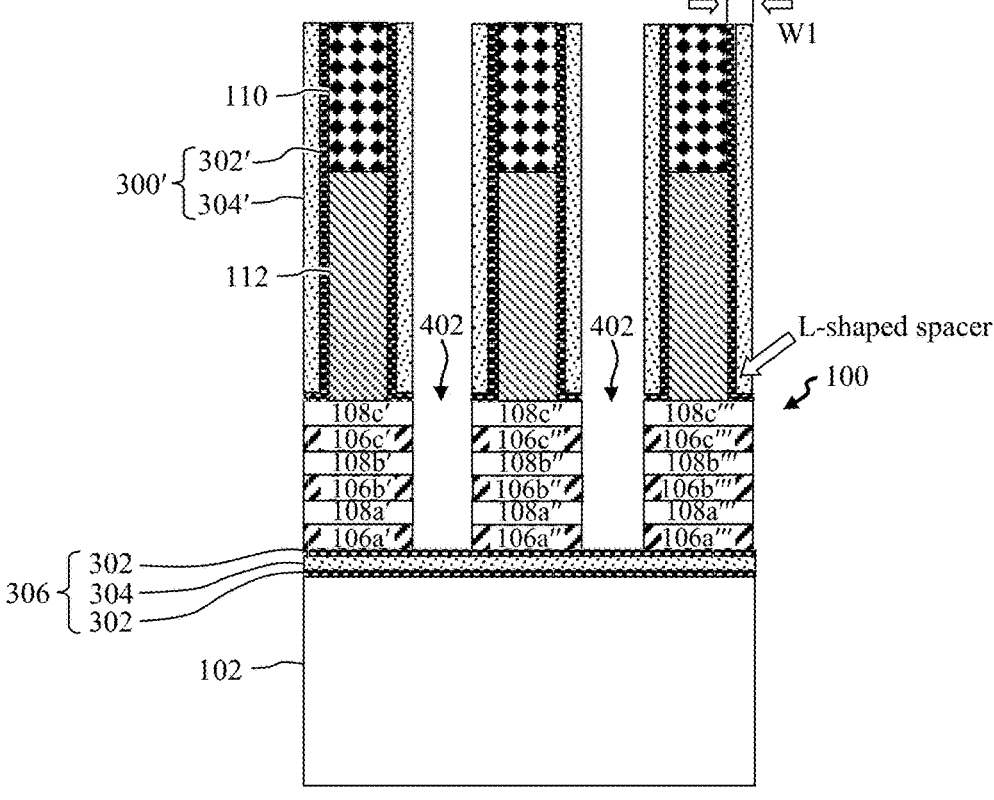
FIG. 4 is a cross-sectional diagram illustrating trenches having been patterned in the stack in between the sacrificial gates/sacrificial gate hardmasks according to an embodiment of the present invention.

The sacrificial gate hardmasks 110/sacrificial gates 112 and bilayer top gate spacer 300 are then used as a mask to pattern trenches 402 in the stack 100 in between the sacrificial gate hardmasks 110/sacrificial gates 112. See FIG. 4. As shown in FIG. 4, the trenches 402 extend through the stack 100 down to the bottom dielectric isolation layer 306. This patterning of trenches 402 in stack 100 divides the sacrificial layers 106a,b,c,etc. and active layers 108a,b,c,etc. into distinct portions beneath each of the sacrificial gate hardmasks 110/sacrificial gates 112 and bilayer top gate spacer 300. For clarity, these patterned portions of the sacrificial layers 106a,b,c,etc. and active layers 108a,b,c,etc. are now given the reference numerals 106a',b',c',etc. and 108a',b',c',etc., 106a'',b'',c'',etc. and 108a'',b'',c'',etc., 106a''',b''',c''',etc. and 108a''',b''',c''',etc., respectively. Further, since they are patterned from the original stack 100, the patterned portions of the sacrificial layers 106a',b',c',etc., 106a'',b'',c'',etc., 106a''',b''',c''',etc., and the patterned portions of the active layers 108a',b',c',etc., 108a'',b'',c'',etc. and 108a''',b''',c''',etc. have the same composition, dimensions, etc. as the corresponding sacrificial layers 106a,b,c,etc. and active layers 108a,b,c,etc. from which they are patterned.

A directional (anisotropic) etching process such as RIE or a series of RIE steps can be employed for the trench etch. For instance, by way of example only, a nitride-selective RIE can be performed to first open up the bilayer top gate spacer 300 at the base of the sacrificial gates 112. This RIE step will remove horizontal portions of the bilayer top gate spacer 300 such as those present on top of the sacrificial gate hardmasks 110 and on top of the stack 100 in between the sacrificial gates 112. A Si and/or SiGe-selective RIE can then be performed to pattern the trenches 402 through the stack 100 stopping on the bottom dielectric isolation layer 306.

Following the trench etch, patterned portions of the first spacer layer 302 and the second spacer layer 304 (now given reference numerals 302' and 304', respectively) form distinct bilayer top gate spacers (now given reference numeral 300') on opposite sides of the sacrificial gate hardmasks 110/sacrificial gates. It is noted that each of the bilayer top gate spacers 300' currently has a width W1. However, as will be described in detail below, fabrication steps such as the formation of inner spacers and pre-clean processes undesirably reduce the width of the bilayer top gate spacers 300'. However, steps will be taken later in the fabrication flow to recover the gate spacer and thereby avoid the risk of source/drain-to-gate shorting. It is further noted that, following the trench etch, the first spacer layer 302' has a distinct L-shaped design. As will be described in detail below, due to the sequence of the fabrication process and the loss in top spacer thickness throughout that process, the bottom width of the L-shaped spacer layer 302' will end up being less than the width of the inner spacers to be formed in pockets alongside the stack 100.

Figure 5:
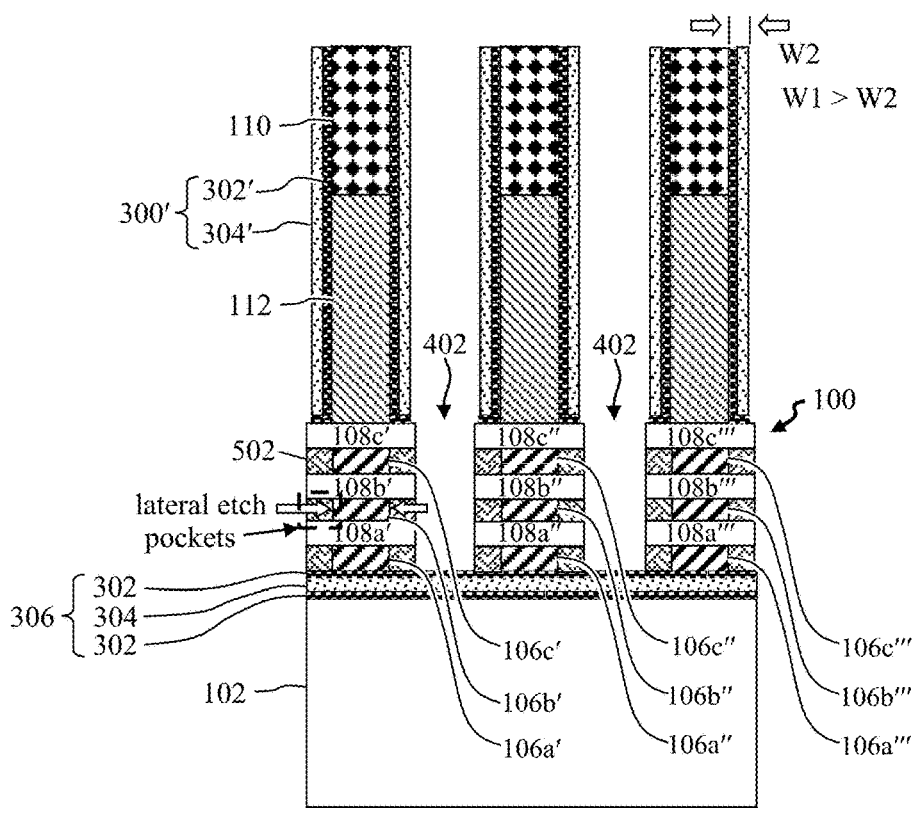
FIG. 5 is a cross-sectional diagram illustrating a selective lateral etch having been performed to recess patterned portions of the sacrificial layers in the stack to form pockets along the sidewalls of the trenches, and inner spacers having been formed in the pockets whereby erosion of the bilayer top gate spacer occurs during formation of the inner spacers according to an embodiment of the present invention.

Namely, inner spacers 502 are next formed alongside the patterned portions of the sacrificial layers 106a',b',c',etc., 106a'',b'',c'',etc., and 106a''',b''',c''',etc. See FIG. 5. Like the bilayer top gate spacers' 300, inner spacers 502 will serve to offset the replacement metal gate from the source/drain regions (which will be formed in the trenches 402—see below). To form the inner spacers 502, a selective lateral etch is first performed to recess the patterned portions of the sacrificial layers 106a',b',c',etc., 106a'',b'',c'',etc., and 106a''',b''',c''',etc. exposed along the sidewalls of the trenches 402. As shown in FIG. 5, this recess etch forms pockets along the sidewalls of the trenches 402 that are then filled with a suitable spacer material(s) to form inner spacers 502 within the pockets. As provided above, in one exemplary embodiment, the sacrificial layers 206a,b,c,etc. (and hence the corresponding patterned portions of the sacrificial layers 106a',b',c',etc., 106a'',b'',c'',etc., and 106a''',b''',c''', etc.) are formed from SiGe. In that case, a SiGe-selective non-directional (isotropic) etching process can be used for the lateral recess etch. Suitable spacer materials for inner spacers 502 include, but are not limited to, silicon nitride (SiN), SiOx, SiC and/or silicon oxycarbide (SiCO). A process such as CVD, ALD or PVD can be employed to deposit the spacer material(s) into the pockets, after which excess spacer material(s) can be removed from the trenches 402 using an isotropic etching process such as RIE.

Notably, there is expected to be some loss of the bilayer top gate spacers 300' during formation of the inner spacers 502. Namely, as shown in FIG. 5, a width of the bilayer top gate spacers 300' has been decreased from W1 (see FIG. 4) to W2 (see FIG. 5), i.e., wherein W1>W2, by the process of forming inner spacers 502. For instance, the etch used to clear excess inner spacer material from the trenches as described above, can also inadvertently remove exposed material from the bilayer top gate spacers 300'. As described above, if unaccounted for, erosion of the spacer offsetting the gate from the source/drain regions can undesirably lead to source/drain-to-gate shorts. Advantageously, as will be described in detail below, the width of the top spacer lost at this, and at various other points in the fabrication process, will be recovered to avoid the risk of source/drain-to-gate shorting.

Figure 6:
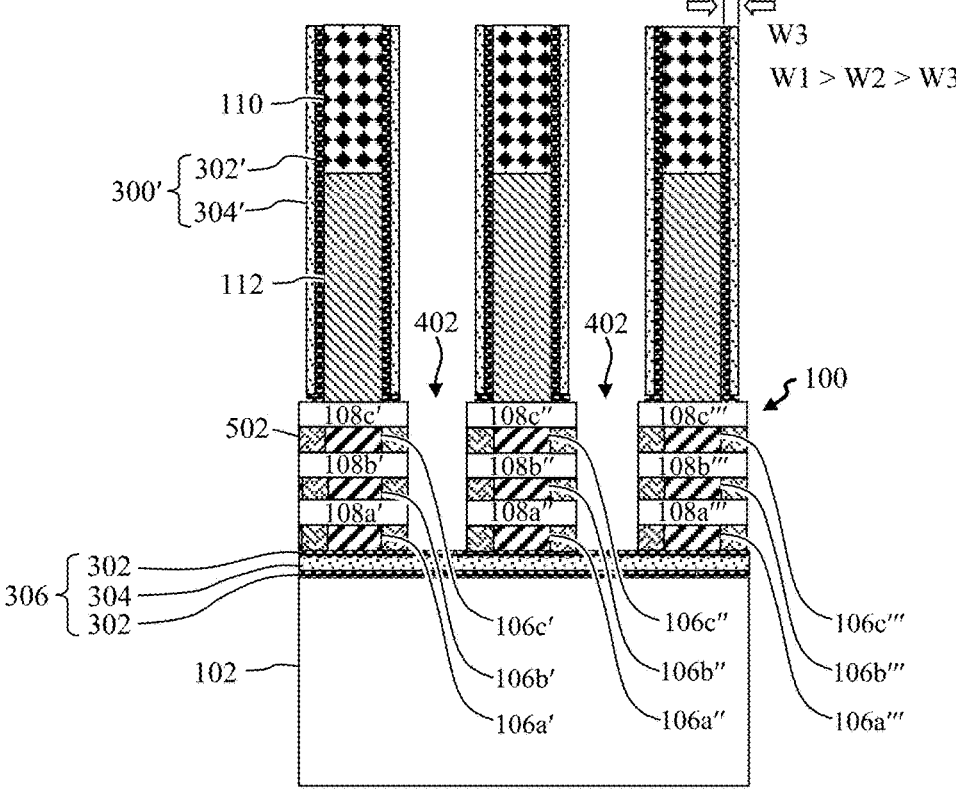
FIG. 6 is a cross-sectional diagram illustrating further erosion of the bilayer top gate spacer that occurs during a pre-clean process employed prior to source/drain region formation according to an embodiment of the present invention.

Another point in the fabrication process where spacer loss can occur is during the pre-clean process employed prior to source/drain region formation. See, e.g., FIG. 6. Namely, according to an exemplary embodiment, a wet chemical treatment (e.g., using hydrofluoric acid (HF) and/or hydrochloric acid (HCl) followed by a rinse with deionized water) and a Siconi® pre-treatment are performed to remove surface oxides. As shown in FIG. 6, doing so can further decrease the width of the exposed bilayer top gate spacers 300', i.e., from W2 (see FIG. 5) to W3 (see FIG. 6), i.e., wherein W1>W2>W3. Further, multiple iterations of this pre-clean process may be needed when separately forming the source/drain regions for n-channel FET (NFET) and p-channel FET (PFET) devices. Advantageously, as will be described in detail below, the width of the top spacer lost at this, and at various other points in the fabrication process, will be recovered to avoid the risk of source/drain-to-gate shorting.

Figure 7:
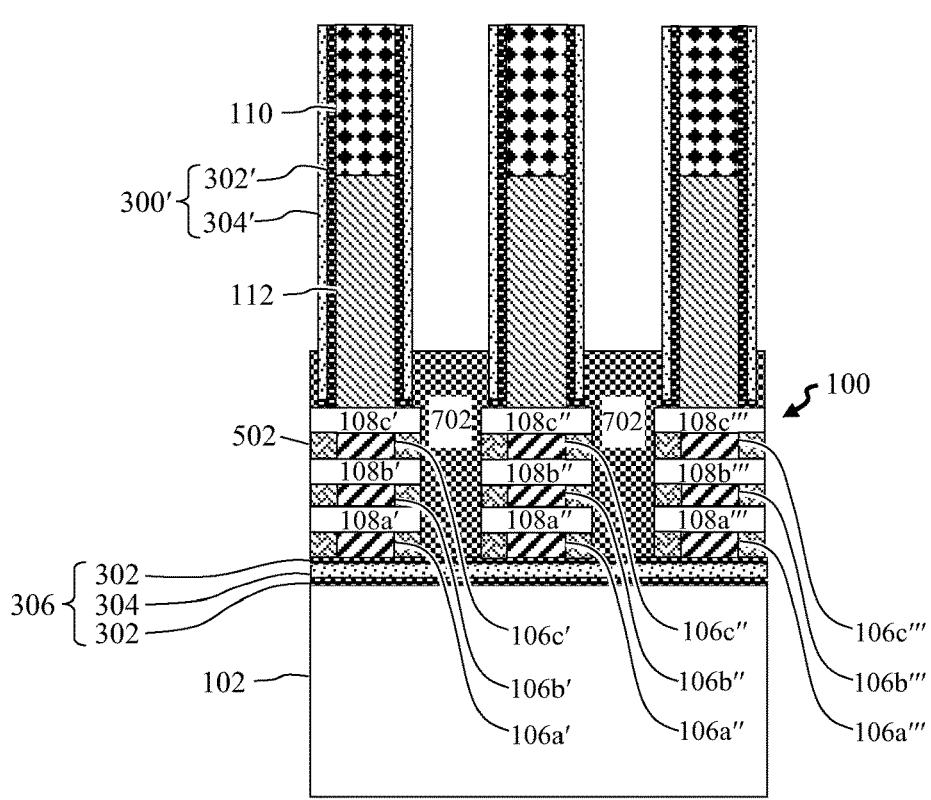
FIG. 7 is a cross-sectional diagram illustrating source/drain regions having been formed in, and above, the trenches on opposite sides of the sacrificial gates alongside the patterned portions of the sacrificial and active layers according to an embodiment of the present invention.

Next, source/drain regions 702 are formed in, and above, the trenches 402 on opposite sides of the sacrificial gates 112 alongside the patterned portions of the sacrificial layers 106a',b',c',etc., 106a'',b'',c'',etc., and 106a''',b''',c''',etc. and the patterned portions of the active layers 108a',b',c',etc., 108a'',b'',c'',etc., and 108a''',b''',c''',etc. According to an exemplary embodiment, source/drain regions 702 are formed from an in-situ doped (i.e., during growth) or ex-situ doped (e.g., via ion implantation) epitaxial material such as epitaxial Si, epitaxial SiGe, etc. By way of example only, the source/drain regions 702 shown can be that of an NFET device and/or a PFET device. In one exemplary embodiment, NFET device source/drain regions 702 are formed from epitaxial Si in-situ or ex-situ doped with an n-type dopant, and PFET device source/drain regions 702 are formed from epitaxial SiGe in-situ or ex-situ doped with a p-type dopant. Suitable p-type dopants include, but are not limited to, boron (B). Suitable n-type dopants include, but are not limited to, phosphorous (P) and/or arsenic (As). With inner spacers 502 in place along the sidewalls of the trenches 402 covering the patterned portions of the sacrificial layers 106a',b',c',etc., 106a'',b'',c'',etc., and 106a''',b''',c''',etc., epitaxial growth of the source/drain regions 702 is templated only from the ends of the patterned portions of the active layers 108a',b',c',etc., 108a'',b'',c'',etc., and 108a''',b''',c''', etc. along the sidewalls of the trenches 402. As shown in FIG. 7, the source/drain regions 702 are separated from the substrate 102 by the bottom dielectric isolation layer 306.

It is notable that, with the currently reduced width W3 of the bilayer top gate spacers 300' (see FIG. 6—described above), there is an increased risk of shorting between the source/drain regions 702 and the gates. Namely, there is only small slivers of the bilayer top gate spacers 300' now separating the sacrificial gates 112 from the source/drain regions 702. However, steps will now be taken to increase the gap between the sacrificial gates 112 and the source/drain regions 702, followed by the deposition of a dielectric liner in that gap to recover the gate spacer width.

Figure 8:
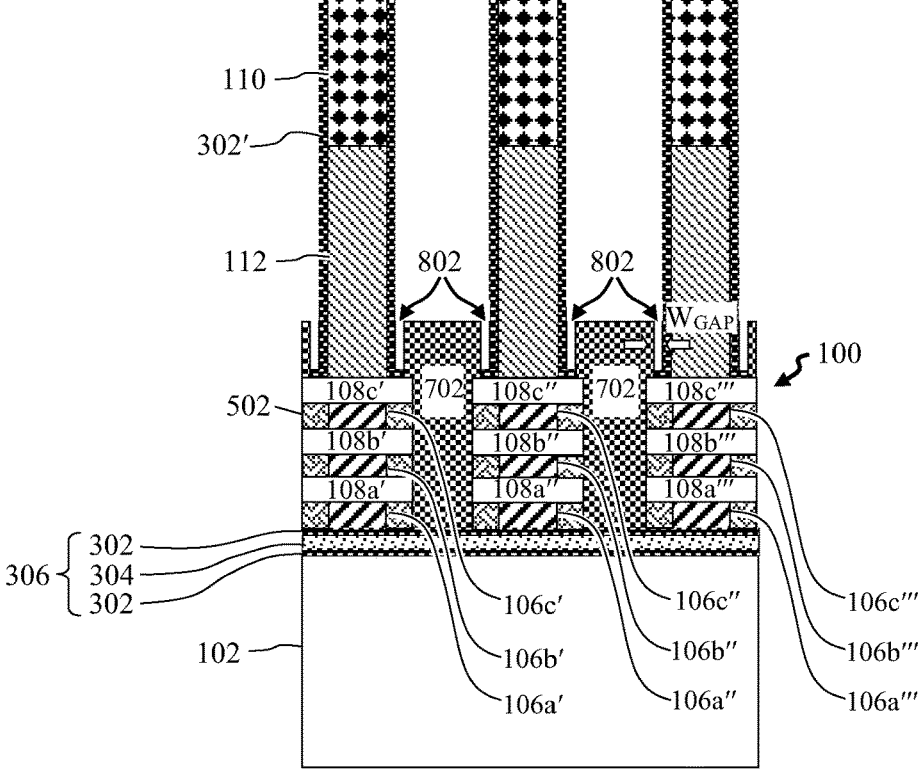
FIG. 8 is a cross-sectional diagram illustrating the second spacer layer of the bilayer top gate spacers having been selectively removed forming gaps between the sacrificial gates and the source/drain regions according to an embodiment of the present invention.

In order to increase the gap between the sacrificial gates 112 and the source/drain regions 702, the second spacer layer 304' of bilayer top gate spacers 300' is first selectively removed, in its entirety, forming gaps 802 between the sacrificial gates 112 and the source/drain regions 702. See FIG. 8. As shown in FIG. 8, the gaps 802 initially have a width W$_{GAP}$. As provided above, the second spacer layer 304' can be formed from a material such as SiN and/or SiC. In that case, an anisotropic plasma etching process can be employed to remove the second spacer layer 304' selective to the first spacer layer 302'. As shown in FIG. 8, the first spacer layer 302' remains present alongside the sacrificial gate hardmasks 110/sacrificial gates 112, and will protect these structures during the subsequent trimming of the source/drain regions 702. Advantageously, removing the second spacer layer 304' to create the initial (vertical) gaps 802 will enable this trimming of the source/drain regions 702 to occur laterally from the sides of source/drain regions 702 (as well as vertically from the top of source/drain regions 702), further increasing the gaps between the sacrificial gates 112 and the source/drain regions 702. A larger gap can accommodate a thicker dielectric liner, meaning that more of the gate spacer width can be recovered.

Figure 9:
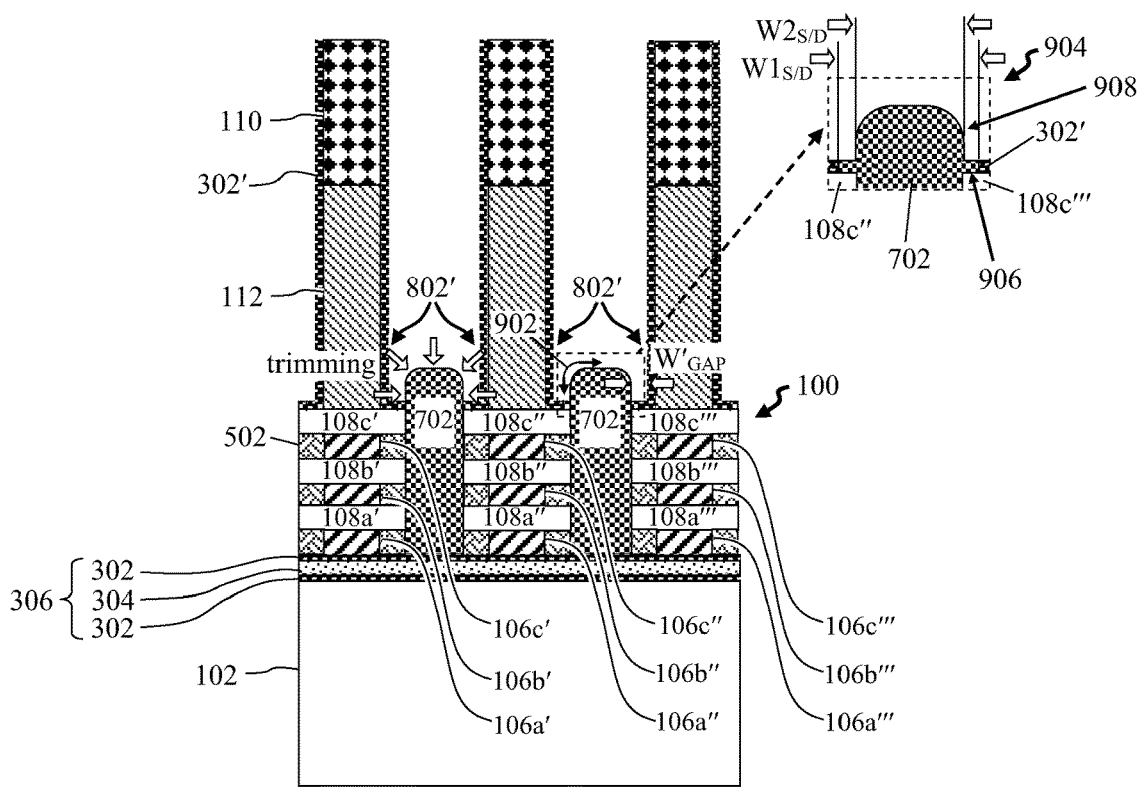
FIG. 9 is a cross-sectional diagram illustrating a selective trimming of the source/drain regions having been performed to enlarge the gaps according to an embodiment of the present invention.

A selective trimming of the source/drain regions 702 is next performed to enlarge the gaps 802. See FIG. 9. The enlarged gaps are now given reference numeral 802'. As shown in FIG. 9, the trimming of the source/drain regions 702 occurs laterally from the sides of source/drain regions 702, as well as vertically from the top of source/drain regions 702. Gaps 802' now have a larger width $W'_{GAP}$. Namely, looking at the initial gaps 802, it can be seen that $W'_{GAP}$ of gaps 802' (see FIG. 9) is greater than $W_{GAP}$ of gaps 802 (see FIG. 8), i.e., $W'_{GAP} > W_{GAP}$. It is in these enlarged gaps 802' that a dielectric liner will be deposited in order to recover the gate spacer width (see below). As is apparent from the present description, the term 'recover' as used herein refers to the notion that the width of the bilayer top gate spacers 300' lost to erosion during fabrication, can now be restored (i.e., recovered) via the addition of the dielectric liner. Further, by laterally trimming the source/drain regions 702, the dielectric liner can be effectively placed in larger gaps 802', thereby recovering a larger spacer width.

According to an exemplary embodiment, selective trimming of the source/drain regions 702 is carried out using an atomic layer etching (ALE) process. For instance, as provided above, the source/drain regions 702 can be formed from an in-situ or ex-situ doped epitaxial material such as epitaxial Si or epitaxial SiGe. An ALE process using a hydrogen ($H_2$)/tetrafluoromethane ($CF_4$)/argon (Ar) plasma can be employed to selectively trim epitaxial Si source/drain regions 702, whereas an ALE process using a $CF_4$/oxygen ($O_2$) plasma can be employed to selectively trim epitaxial SiGe source/drain regions 702.

As shown in FIG. 9, the trimming results in a unique structure for the source/drain regions 702. For instance, the portion of the source/drain regions 702 that were trimmed, namely those portions 908 of the source/drain regions 702 above the stack 100 (see description of inset 904 below) now have a domed profile with rounded corners as indicated by arrow 902. Further, as shown in inset 904, which provides an enlarged view of the top of the source/drain regions 702, the trimming can result in portions 906 of the source/drain regions 702 abutting the first spacer layer 302' having a width $W1_{S/D}$ that is greater than a width $W2_{S/D}$ of the portions 908 of the source/drain regions 702 above the stack 100, i.e., $W1_{S/D} > W2_{S/D}$.

Next, a dielectric liner 1002 is conformally deposited onto the first spacer layer 302', onto exposed surfaces of the source/drain regions 702 and the sacrificial gate hardmasks 110, and into/filling the gaps 802'. See FIG. 10. Notably, the dielectric liner 1002 is disposed directly on the trimmed portions 908 (see above) of the source/drain regions 702 above the stack 100. As described in detail above, the deposition of dielectric liner 1002 serves to recover the width of the bilayer top gate spacers 300' lost during fabrication.

In general, any suitable dielectric material can be employed for dielectric liner 1002, including those materials provided above for the first spacer layer 302/302' (e.g., SiOCN and/or SiBCN) and/or those materials provided above for the second spacer layer 304/304' (e.g., SiN and/or SiC). However, since the dielectric liner 1002 is placed after the (trimmed) source/drain regions 702, the as-deposited dielectric liner 1002 will cover over the source/drain regions 702. Thus, when it comes time to form contacts to the source/drain regions 702 (see below), these contacts need to extend through the dielectric liner 1002 in order to access the source/drain regions 702. As such, according to an exemplary embodiment, in addition to recovering the width of the top gate spacer, the dielectric liner 1002 also serves as a contact etch stop layer/liner (CESL). By way of example only, suitable CESL materials include, but are not limited to, SiOx and/or SiN. Use of a CESL advantageously facilitates the patterning of contact features (such as vias and/or trenches) by providing an etch stop near the endpoint of the features.

Figure 10:
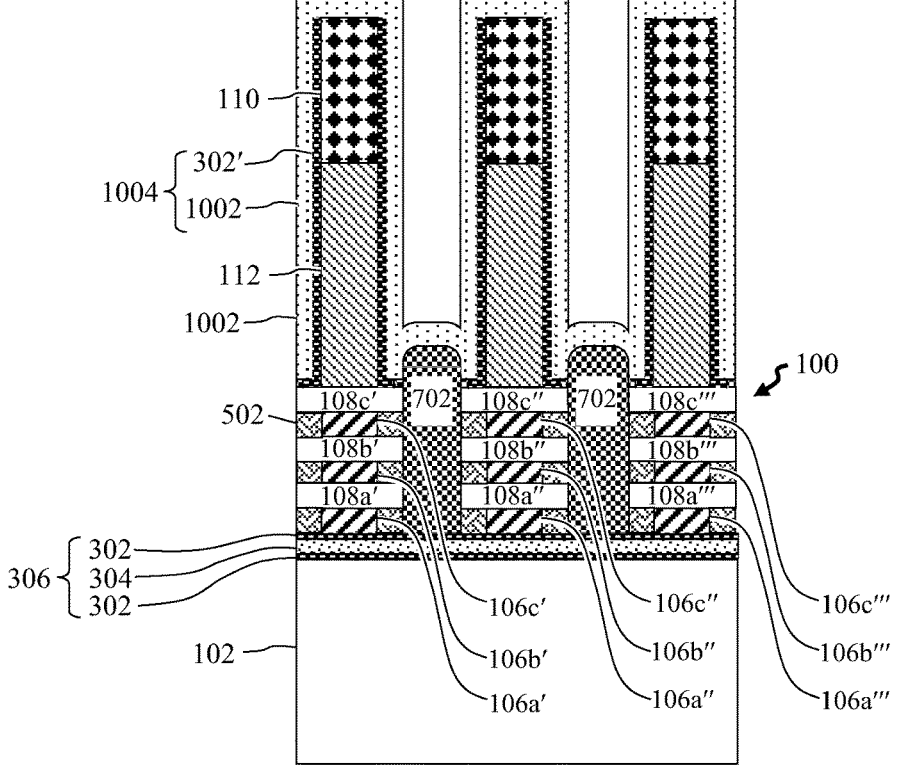
FIG. 10 is a cross-sectional diagram illustrating a dielectric liner having been deposited onto the first spacer layer, onto exposed surfaces of the source/drain regions and the sacrificial gate hardmasks, and into/filling the gaps to recover the width of the gate spacer according to an embodiment of the present invention.
Figure 11:
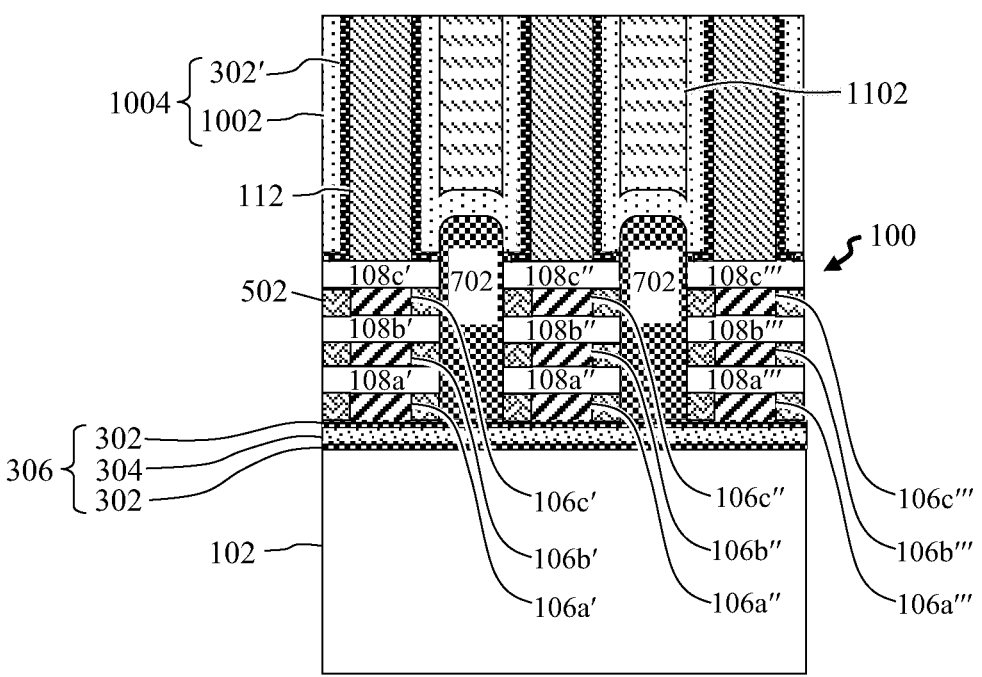
FIG. 11 is a cross-sectional diagram illustrating the sacrificial gates having been buried in an interlayer dielectric (ILD) according to an embodiment of the present invention.

A process such as CVD, ALD or PVD can be employed to deposit the dielectric liner 1002. According to an exemplary embodiment, the dielectric liner 1002 is deposited to a thickness of from about 2 nm to about 10 nm and ranges therebetween. As shown in FIG. 10, the first spacer layer 302' and the dielectric liner 1002 collectively form a gate spacer 1004 that offsets the sacrificial gates 112 from the source/drain regions 702 above the stack 100. Similarly, inner spacers 502 serve the same function of offsetting the sacrificial gates 112 from the source/drain regions 702 within the stack 100.

As part of the RMG process, the next task is to selectively remove the sacrificial gates 112 and replace them with the replacement metal gates. To do so, the sacrificial gate hardmasks 110 and sacrificial gates 112 are first buried in an interlayer dielectric (ILD) 1102 which is then polished down to, and exposing, the tops of the sacrificial gates 112. See FIG. 11. By way of example only, suitable materials for ILD 1102 include, but are not limited to, low-κ dielectric materials such as SiOx and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD, or PVD can be employed to deposit the ILD 1102, after which the ILD 1102 can be polished using a process such as chemical mechanical polishing (CMP). This CMP step removes the sacrificial gate hardmasks 110, thereby exposing the underlying sacrificial gates 112, and recesses the gate spacer 1004.

Figure 12:
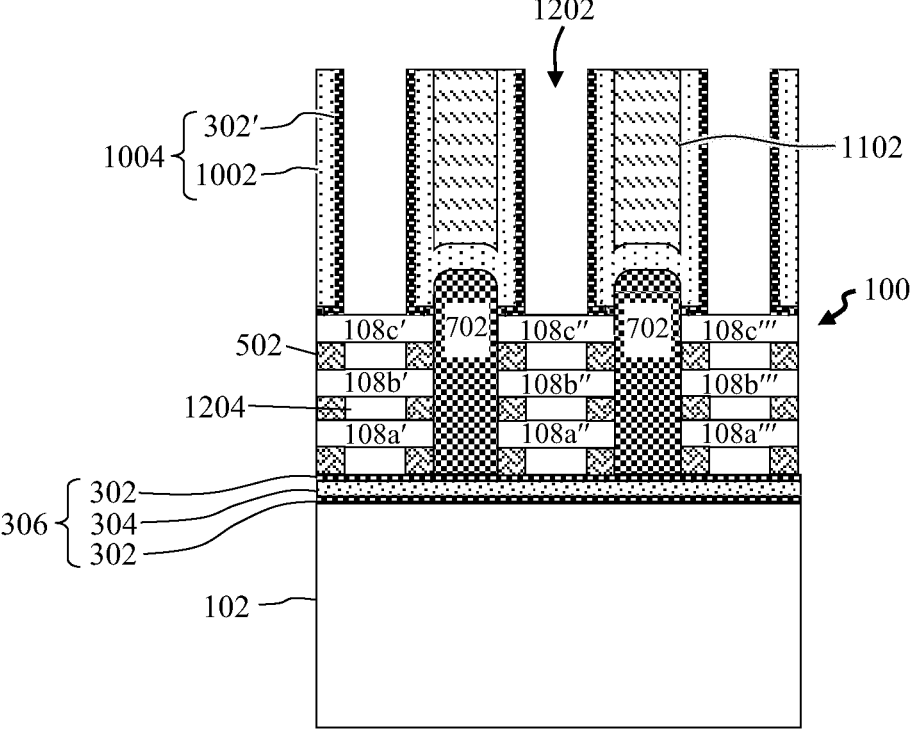
FIG. 12 is a cross-sectional diagram illustrating the sacrificial gates having been selectively removed forming gate trenches in the ILD over the stack in between the source/drain regions, and the patterned portions of the sacrificial layers having been selectively removed forming voids in the stack between the patterned portions of the active layers according to an embodiment of the present invention.

Sacrificial gates 112 are then selectively removed forming gate trenches 1202 in the ILD 1102 over the stack 100 in between the source/drain regions 702. See FIG. 12. As shown in FIG. 12, the patterned portions of the sacrificial layers 106a',b',c',etc., 106a'',b'',c'',etc., 106a''',b''',c''',etc., now accessible through gate trenches 1202, are then selectively removed. As provided above, the sacrificial layers 106a,b,c,etc./the patterned portions of the sacrificial layers 106a',b',c',etc., 106a'',b'',c'',etc., 106a''',b''',c''',etc. can each be formed from SiGe, while the active layers 108a,b,c,etc./ the patterned portions of the active layers 108a',b',c',etc., 108a'',b'',c'',etc. and 108a''',b''',c''',etc. are each formed from Si. In that case, etchants such as wet hot SC1, vapor phase HCl, vapor phase $ClF_3$ and other RCP techniques selective for etching of SiGe versus Si can be employed to selectively remove the sacrificial layers relative to the active layers.

Removal of the patterned portions of the sacrificial layers 106a',b',c',etc., 106a'',b'',c'',etc., 106a''',b''',c''',etc. releases the patterned portions of the active layers 108a',b',c',etc., 108a'',b'',c'',etc. and 108a''',b''',c''',etc. from the stack 100 in the channel regions of the FET device. Voids 1204 are now present in the stack 100 in between the patterned portions of the active layers 108*a'*,*b'*,*c'*,etc., 108*a''*,*b''*,*c''*,etc. and 108*a'''*, *b'''*,*c'''*,etc. in the channel regions of the FET device. The patterned portions of the active layers 108*a'*,*b'*,*c'*,etc., 108*a''*, *b''*,*c''*,etc. and 108*a'''*,*b'''*,*c'''*,etc. form the channels of the FET device. As will be described in detail below, replacement metal gates, i.e., including a gate dielectric and at least one workfunction-setting metal, will be formed in the gate trenches 1202 and in the voids 1204 that fully surround a portion of each of the patterned portions of the active layers 108*a'*,*b'*,*c'*,etc., 108*a''*,*b''*,*c''*,etc. and 108*a'''*,*b'''*,*c'''*,etc. in a gate-all-around (GAA) configuration.

Figure 13:
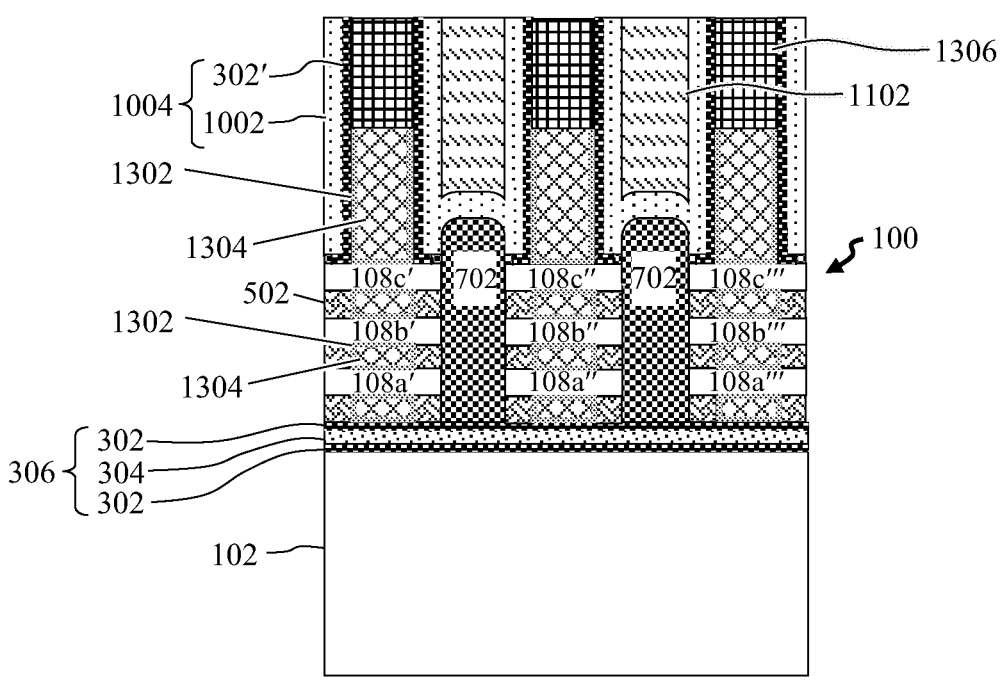
FIG. 13 is a cross-sectional diagram illustrating a conformal gate dielectric having been deposited into and lining each of the gate trenches and the voids, and at least one workfunction-setting metal having been deposited into the gate trenches and the voids over the gate dielectric to form replacement metal gates, and dielectric caps having been formed over the replacement metal gates according to an embodiment of the present invention.

Namely, as shown in FIG. 13, formation of the replacement metal gates begins with the deposition of a conformal gate dielectric 1302 into and lining each of the gate trenches 1202 and the voids 1204, with the conformal gate dielectric 1302 being disposed on the patterned portions of the active layers 108*a'*,*b'*,*c'*,etc., 108*a''*,*b''*,*c''*,etc. and 108*a'''*,*b'''*,*c'''*,etc. in the channel region of the FET device. According to an exemplary embodiment, gate dielectric 1302 is a high-κ material. The term "high-κ," as used herein, refers to a material having a relative dielectric constant κ which is much higher than that of silicon dioxide (e.g., a dielectric constant κ=25 for hafnium oxide (HfO$_2$) rather than 4 for SiO$_2$). Suitable high-κ gate dielectrics include, but are not limited to, HfO$_2$ and/or lanthanum oxide (La$_2$O$_3$). A process such as CVD, ALD or PVD can be employed to deposit the gate dielectric 1302 into the gate trenches 1202 and into the voids 1204. According to an exemplary embodiment, gate dielectric 1302 has a thickness of from about 1 nm to about 5 nm and ranges therebetween. A reliability anneal can be performed following deposition of the gate dielectric 1302. For instance, according to an exemplary embodiment, a reliability anneal of the gate dielectric 1302 is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as nitrogen.

At least one workfunction-setting metal 1304 is then deposited into the gate trenches 1202 and the voids 1204 over the gate dielectric 1302. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN) and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n-type and p-type workfunction-setting metals given above. A process such as CVD, ALD or PVD can be employed to deposit the workfunction-setting metal(s) 1304, after which the metal overburden can be removed using a process such as CMP.

As shown in FIG. 13, the gate dielectric 1302 and workfunction-setting metal(s) 1304 are then recessed, and dielectric caps 1306 are formed in gate trenches 1202 over the (recessed) gate dielectric 1302 and workfunction-setting metal(s) 1304. Suitable materials for the dielectric caps 1306 include, but are not limited to, SiOx and/or SiN. A process such as CVD, ALD or PVD can be employed to deposit the material(s) for the dielectric caps 1302 into the gate trenches 1202, after which the material can be planarized using a process such as CMP. Now present is a FET device structure having at least one replacement metal gate, i.e., gate dielectric 1302 and workfunction-setting metal(s) 1304, source/drain regions 702 on opposite sides of the at least one replacement metal gate, and at least one channel, i.e., the patterned portions of the active layers 108*a'*,*b'*,*c'*,etc., 108*a''*, *b''*,*c''*,etc. and 108*a'''*,*b'''*,*c'''*,etc., interconnecting the source/drain regions 702.

Contacts to the source/drain regions 702 will next be formed, during which the dielectric caps 1306 will serve to protect the underlying replacement metal gates, and the dielectric liner 1002 can act as a CESL during patterning of the contact features. To form contacts to the source/drain regions 702, an additional ILD 1402 is deposited onto ILD 1102 over the gate spacer 1004, the replacement metal gates (i.e., the gate dielectric 1302 and workfunction-setting metal(s) 1304) and the dielectric caps 1306, and contact features 1404 (e.g., contact vias and/or contact trenches) are patterned in the ILD 1102/ILD 1402. See FIG. 14.

By way of example only, suitable materials for ILD 1402 include, but are not limited to, low-κ dielectric materials such as SiOx and/or SiCOH and/or ULK-ILD materials such as pSiCOH. A process such as CVD, ALD, or PVD can be employed to deposit the ILD 1402, after which the ILD 1402 can be polished using a process such as CMP. Standard lithography and etching techniques (see above) can be employed to pattern the contact features 1404 in the ILD 1102/ILD 1402. A directional (anisotropic) etching process such as RIE can be employed for the contact feature etch.

Figure 14:
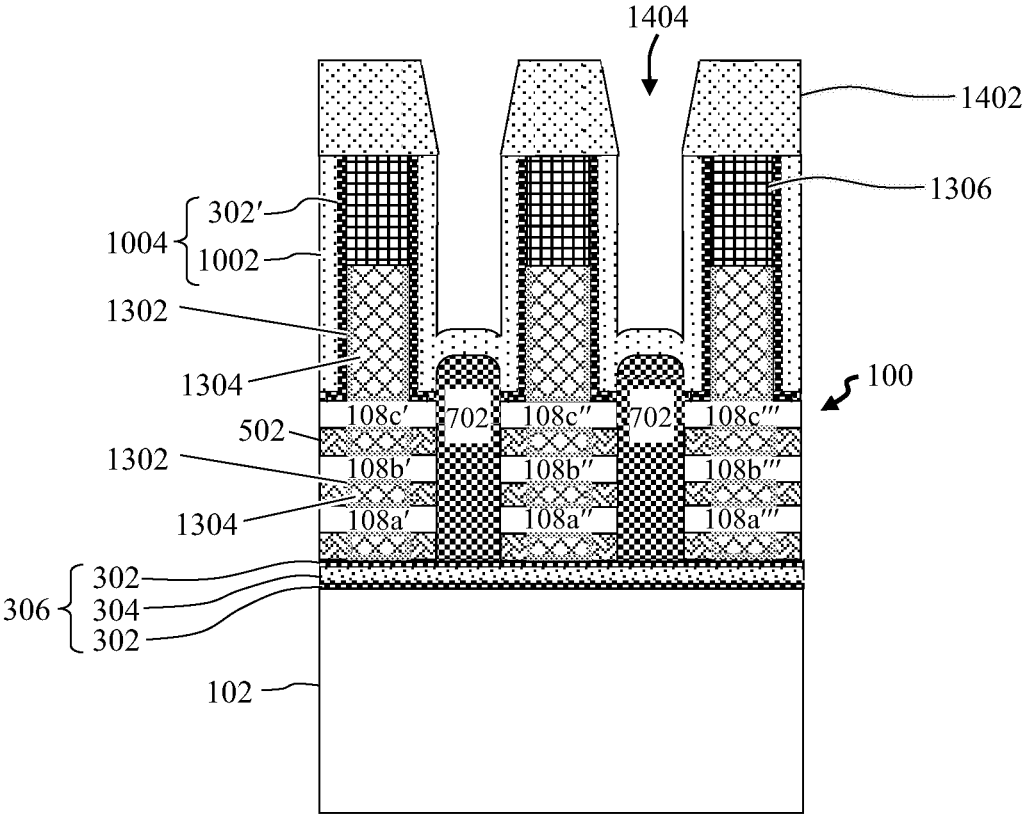
FIG. 14 is a cross-sectional diagram illustrating an additional ILD having been deposited onto the ILD over the replacement metal gates and the dielectric caps, and contact features having been patterned in the ILD/additional ILD according to an embodiment of the present invention.

According to the exemplary embodiment, the dielectric liner 1002 serves as a CESL during patterning of the contact features 1404. Namely, as shown in FIG. 14, the contact features 1404 extend through the ILD 1102 and the ILD 1402, in between the replacement metal gates and the dielectric caps 1306, down to the dielectric liner 1002. Use of a CESL advantageously permits the patterning of a major portion of the contact features 1404 without the concern of overetching into the underlying source/drain regions 702, since the dielectric liner 1002 is present as an etch stop at the bottom of the contact features 1404. As will be described in detail below, the contact features 1404 then only need to be extended a short distance through the dielectric liner 1002 in order to expose the source/drain regions 702, which is easier to control. In order to serve as a CESL, the dielectric liner 1002 should be formed from a material having etch selectivity to the ILD 1102 and the ILD 1402. For instance, by way of example only, when the ILD 1102 and the ILD 1402 are formed from an oxide material, then dielectric liner 1002 can be formed from a nitride material such as SiN (see above), or vice versa.

Figure 15:
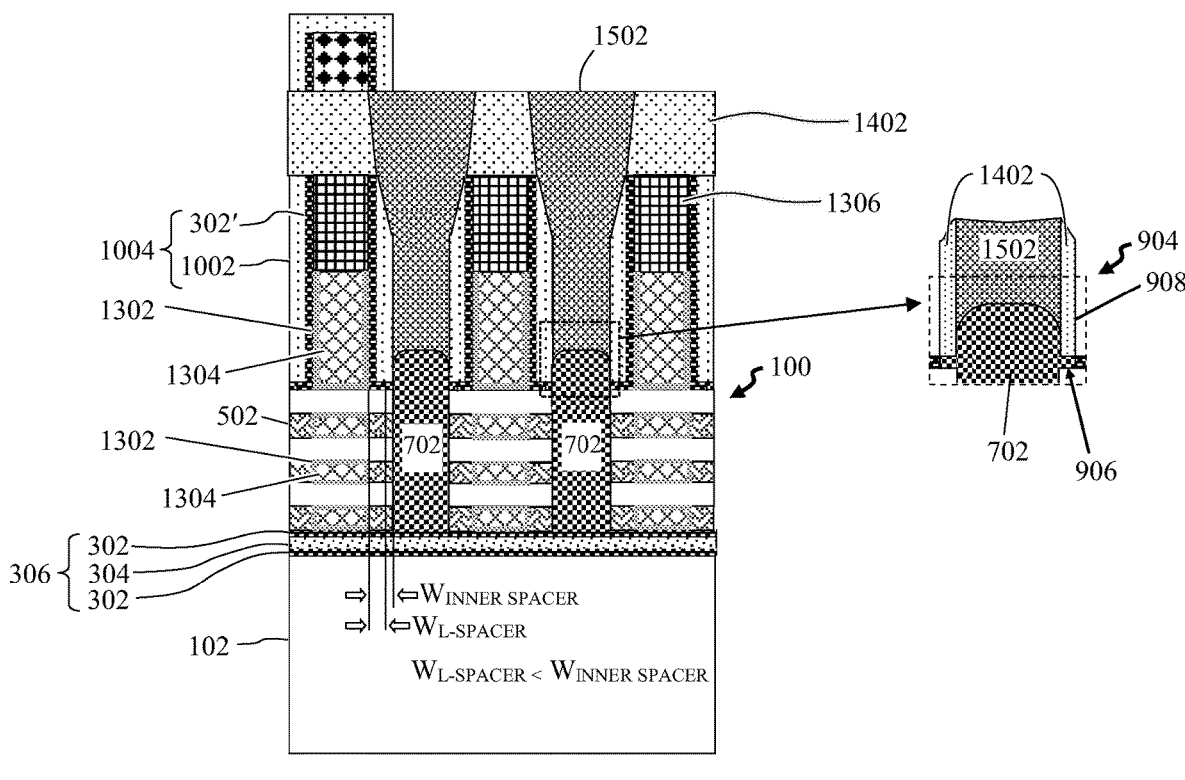
FIG. 15 is a cross-sectional diagram illustrating the contact features having been extended through the dielectric liner, and a contact metal(s) having been deposited into the contact features to form contacts to the source/drain regions according to an embodiment of the present invention.

The contact features 1404 are then extended through the dielectric liner 1002, exposing the underlying source/drain regions 702, and a contact metal(s) is/are deposited into the contact features 1404 to form contacts 1502 to the source/drain regions 702. See FIG. 15. According to an exemplary embodiment, the contact features 1404 are patterned using a multi-step RIE. For instance, using the above scenario only as an illustrative, non-limiting example, if the ILD 1102 and the ILD 1402 are both formed from an oxide material and the dielectric liner 1002 is formed from a nitride material, then an oxide-selective RIE step can be performed to pattern the contact features 1404 in the ILD 1102/ILD 1402 stopping on the dielectric liner 1002 (CESL). A nitride-selective RIE step can then be performed to extend the contact features 1404 through the dielectric liner 1002 down to the underlying source/drain regions 702. As shown in FIG. 15, this follow-up RIE can expand the top openings of the contact features 1404 in the dielectric liner 1002. However, the replacement metal gates remain protected by the dielec- tric caps 1306 and the first spacer layer 302'.

Suitable contact metals include, but are not limited to, copper (Cu), tungsten (W), ruthenium (Ru), cobalt (Co), nickel (Ni) and/or platinum (Pt). The contact metal(s) can be deposited into the contact features 1404 using a process such as evaporation, sputtering, or electrochemical plating. Following deposition, the contact metal overburden can be removed using a process such as CMP.

Referring to the FET device shown in FIG. 15, one unique feature of the present device structure can be seen. For instance, as highlighted above, the first spacer layer 302' has a distinct L-shaped design alongside the replacement metal gates, i.e., the gate dielectric 1302 and workfunction-setting metal(s) 1304, and the dielectric caps 1306. Notably, as shown in FIG. 15, a width $W_{L\text{-}SPACER}$ at a bottom of the first spacer layer 302' is less than a width $W_{INNER\ SPACER}$ of the inner spacers 502, i.e., $W_{L\text{-}SPACER} < W_{INNER\ SPACER}$. This difference in spacer width is due to the erosion of the bilayer top gate spacer 300' that occurs above the stack 100 during fabrication (see above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field-effect transistor (FET) device, comprising:
a gate;
a source/drain region laterally adjacent to the gate, comprising a protrusion protruding laterally away from a sidewall of the source/drain region;
a channel comprising a nanosheet stack interconnecting the source/drain region to a second source/drain region; and
an L-shaped gate spacer offsetting the gate from the source/drain region, wherein:
the L-shaped gate spacer contacts a top surface of the nanosheet stack and is alongside a sidewall of the gate; and
a single distal surface of the L-shaped gate spacer directly contacts a distal surface of the protrusion, wherein the protrusion protrudes directly and laterally over an upper-most portion of the nanosheet stack.

2. The FET device of claim 1, wherein the L-shaped gate spacer comprises a material selected from the group consisting of: silicon oxycarbonitride (SiOCN), silicon borocarbonnitride (SiBCN), and combinations thereof.

3. The FET device of claim 1, further comprising:
a dielectric liner directly on the L-shaped gate spacer, wherein the dielectric liner is between the L-shaped gate spacer, a side of the source/drain region, and a portion of a contact to the source/drain region; and
wherein the channel comprises multiple channels oriented vertically one on top of another in the nanosheet stack.

4. The FET device of claim 3, wherein the gate surrounds a portion of each of the multiple channels in a gate-all-around configuration.

5. The FET device of claim 3, further comprising:
inner spacers between a plurality of workfunction setting metal layers in the nanosheet stack and a portion of the source/drain region.

6. The FET device of claim 5, wherein a width at a bottom of the L-shaped gate spacer is less than a width of the inner spacers.

7. The FET device of claim 5, wherein the inner spacers comprise a material selected from the group consisting of: silicon nitride (SiN), silicon oxide (SiOx), silicon carbide (SiC), silicon oxycarbide (SiCO), and combinations thereof.

8. The FET device of claim 3, wherein a portion of the source/drain region is present above the top surface of the nanosheet stack.

9. The FET device of claim 8, wherein the portion of the source/drain region present above the top surface of the nanosheet stack has a domed profile with rounded corners.

10. The FET device of claim 8, wherein the dielectric liner contacts the dielectric liner, a side of the portion of the source/drain region, a contact, and a portion of the top surface of the nanosheet stack.

11. The FET device of claim 10, wherein the FET device further comprises a contact to the source/drain region, wherein the contact extends through the dielectric liner.

12. The FET of claim 11, wherein the dielectric liner comprises a material selected from the group consisting of: SiOx, SiN, and combinations thereof.

13. The FET device of claim 8, wherein another portion of the source/drain region is present abutting the L-shaped gate spacer, and wherein a width of the another portion of the source/drain region is $W1_{S/D}$.

14. The FET device of claim 13, wherein:
the portion of the source/drain regions present above the nanosheet stack, not in contact with the L-shaped gate spacer, have a width $W2_{S/D}$; and
$$W1_{S/D} > W2_{S/D}.$$

15. The FET device of claim 1, wherein the L-shaped gate spacer directly on the nanosheet stack further comprises the L-shaped gate spacer on a top channel of the nanosheet stack.

16. The FET device of claim 5, wherein the inner spacers have horizontal width of a first width and wherein a distance between one contact of the contacts and the gate adjacent to the contact is the first width.

* * * * *